United States Patent
Snyder et al.

(10) Patent No.: US 9,762,987 B2
(45) Date of Patent: Sep. 12, 2017

(54) ENCLOSURE FOR SUPPORTING ACOUSTIC EQUIPMENT

(71) Applicant: WILDLIFE ACOUSTICS, INC., Maynard, MA (US)

(72) Inventors: Sherwood Kenneth Snyder, Ithaca, NY (US); Theodore J. Wright, Acton, MA (US); Thomas A. Hagerty, Somerville, MA (US); Ivan Mark Lazich, Lynnfield, MA (US)

(73) Assignee: WILDLIFE ACOUSTICS, INC., Maynard, MA (US)

( * ) Notice: Subject to any disclaimer, the term of this patent is extended or adjusted under 35 U.S.C. 154(b) by 112 days.

(21) Appl. No.: 14/848,724

(22) Filed: Sep. 9, 2015

(65) Prior Publication Data

US 2017/0070794 A1 Mar. 9, 2017

(51) Int. Cl.
| | |
|---|---|
| *A45C 7/00* | (2006.01) |
| *H04R 1/02* | (2006.01) |
| *G11B 20/10* | (2006.01) |
| *G11B 33/02* | (2006.01) |
| *G11B 33/14* | (2006.01) |

(Continued)

(52) U.S. Cl.
CPC .............. *H04R 1/02* (2013.01); *A01M 31/002* (2013.01); *G11B 20/10527* (2013.01); *G11B 33/022* (2013.01); *G11B 33/025* (2013.01); *G11B 33/14* (2013.01); *G11B 33/1446* (2013.01); *H05K 7/1427* (2013.01); *G11B 2020/10546* (2013.01)

(58) Field of Classification Search
CPC .... G11B 2020/10546; G11B 20/10527; G11B 33/022; G11B 33/025; G11B 33/14; G11B 33/1446; H04R 1/02; H05K 7/1427; A01M 31/002

USPC ............ 190/1, 22, 103, 107, 109, 111, 119; 220/818; 312/223.1

See application file for complete search history.

(56) References Cited

U.S. PATENT DOCUMENTS

| | | | | |
|---|---|---|---|---|
| 3,443,671 A | * | 5/1969 | Dyke | .................. A45C 7/0027 190/103 |
| 5,239,587 A | | 8/1993 | Muckelrath | |

(Continued)

OTHER PUBLICATIONS

International Search Report and Written Opinion of the International Searching Authority from corresponding PCT/U2016/050881 dated Dec. 14, 2016.

*Primary Examiner* — Vivian Chin
*Assistant Examiner* — Friedrich W Fahnert
(74) *Attorney, Agent, or Firm* — Lando & Anastasi, LLP (57) ABSTRACT

An apparatus includes acoustic equipment and an enclosure to support the acoustic equipment. The enclosure includes a front cover member, a middle cover member, a back cover member, and a hinge to connect the front cover member to the back cover member. The hinge enables the movement of the front cover member and the back cover member between an open position and a closed position. The middle cover member is disposed between the front cover member and the back cover member, with the middle cover member being connected to the hinge to enable movement of the middle cover member and the back cover member between an open position and a closed position. The enclosure further includes a first latch configured to releasably secure the middle cover member to the back cover member, and a second latch configured to releasably secure the front cover member to the back cover member.

20 Claims, 11 Drawing Sheets

(51) Int. Cl.
  *H05K 7/14*     (2006.01)
  *A01M 31/00*    (2006.01)

(56)      References Cited

U.S. PATENT DOCUMENTS

| | | | |
|---|---|---|---|
| 5,358,082 A * | 10/1994 | Armstrong, IV | A45C 7/0022 |
| | | | 190/127 |
| D353,265 S | 12/1994 | Newby, Sr. | |
| 5,572,592 A | 11/1996 | Muckelrath | |
| D441,954 S | 5/2001 | Parker | |
| D472,384 S | 4/2003 | Richardson | |
| D516,309 S | 3/2006 | Richardson et al. | |
| D690,510 S | 10/2013 | Fux | |
| D710,611 S | 8/2014 | To et al. | |
| D779,203 S | 2/2017 | Kinskey | |
| 2005/0075045 A1 | 4/2005 | Williamson | |
| 2009/0071780 A1* | 3/2009 | Sijmons | A45C 13/18 |
| | | | 190/101 |
| 2012/0067914 A1 | 3/2012 | Sadler et al. | |

* cited by examiner

ENCLOSURE FOR SUPPORTING ACOUSTIC EQUIPMENT

BACKGROUND

Field of Invention

The present invention is directed to battery-operated, autonomous data recording devices, and more particularly to an enclosure that is particularly suited to supporting acoustic equipment in harsh environments.

Discussion of Related Art

There are many applications for automated data collection. In particular, the collection of audio data in the field can be used to monitor populations of wildlife, such as birds, bats, frogs and whales for presence, absence, and abundance data for specific species.

One of the greatest challenges in the deployment of data collection equipment in the field is maintaining the integrity of an enclosure supporting the acoustic equipment that is used to record audio, infrasonic and ultrasonic signals. Remote locations can include very harsh environments, which impacts the ability of the enclosure to effectively operate in that climate conditions may penetrate the enclosure. One particular challenge is replacing batteries within the enclosure while maintaining the integrity of the enclosure after the replacement process. The act of opening the enclosure to access and replace batteries in the enclosure oftentimes compromises the integrity of the enclosure.

SUMMARY

One aspect of the disclosure is directed to an apparatus for autonomous data recording comprising acoustic equipment for recording autonomous data and an enclosure to support the acoustic equipment. In one embodiment, the enclosure includes a front cover member, a middle cover member, a back cover member, and at least one hinge configured to connect the front cover member to the back cover member. The at least one hinge enables the movement of the front cover member and the back cover member between an open position in which the front cover member is spaced from the back cover member and a closed position in which the front cover member engages the back cover member. The middle cover member is disposed between the front cover member and the back cover member, with the middle cover member being connected to the at least one hinge to enable movement of the middle cover member and the back cover member between an open position in which the middle cover member is spaced from the back peripheral wall and a closed position in which the middle cover member engages the back peripheral wall. The enclosure further includes a first latch configured to releasably secure the middle cover member to the back cover member to secure the middle cover member and the back cover member in the closed position, and a second latch configured to releasably secure the front cover member to the back cover member to secure the front cover member and the back cover member in the closed position.

Embodiments of the apparatus further may include the front cover member of the enclosure having a front wall and a front peripheral wall extending from the front wall. The back cover member has a back wall and a back peripheral wall extending from the back wall. The enclosure further includes a seal configured to seal a connection between the back peripheral wall of the back cover member and the middle cover member and the front peripheral wall of the front cover member and the middle cover member. The seal may be created by overmolding a low durometer material over a hard durometer material forming a peripheral edge of the middle cover member. The first latch may include a snap-fit member associated with an edge of the middle cover member and a mating snap-fit member associated with the back peripheral wall of the back cover member. The second latch may include a latching member associated with the second latch, which is connected to the front cover member through a hinge that allows the second latch to pivot between an engaged latched position and a disengaged release position and a second mating latching member associated with the back peripheral wall of the back cover member. The second latch may include a locking configuration associated with the second snap-fit member and the second mating snap-fit member, the locking configuration being configured to receive a lock. The at least one hinge may be configured to connect a front edge of the front peripheral wall of the front cover member to a back edge of the back peripheral wall of the back cover member. The middle cover member may include a middle cover edge connected to the at least one hinge. The front cover member may include a first feature and the back cover member includes a second feature. The first feature and the second feature enable stacking of the enclosure on another enclosure. The first feature may include one of several protrusions and recesses formed on the front wall of the front cover member and the second feature includes the other of several protrusions and recesses formed on the back wall of the back cover member. The second latch may be positioned outboard with respect to the first latch. The back cover member may be configured to support at least one battery.

Another aspect of the disclosure is directed to a method of enclosing and sealing acoustic equipment within an enclosure. In one embodiment, the method comprises: providing several components of acoustic equipment within a rear cover member of the enclosure; securing a middle cover member to the rear cover member with a first latch, the middle cover member being configured to support several additional components of acoustic equipment; and sealingly engaging a front cover member to the middle cover member and the rear cover member to the middle cover member with a second latch.

Embodiments of the method further may include connecting the middle cover member to the rear cover member with the at least one hinge. The at least one hinge further enables the movement of the middle cover member and the back cover member between an open position in which the middle cover member is spaced from the back peripheral wall and a closed position in which the middle cover member engages the back peripheral wall. The method further may include a hinged connection of the front cover member to the back cover member with at least one hinge. The at least one hinge enables the movement of the front cover member and the back cover member between an open position in which the front cover member is spaced from the back cover member and a closed position in which the front cover member engages the back cover member. The method further may include locking the second latch with a locking configuration, the locking configuration being configured to receive a lock. The method further may include stacking the enclosure on another enclosure. The front cover member may include a first feature and the back cover member includes a second feature, the first feature and the second feature enabling the stacking of the enclosure on another enclosure. The second latch may be positioned outboard with respect to the first latch.

BRIEF DESCRIPTION OF THE DRAWINGS

Aspects and embodiments of the invention are described in detail below with reference to the accompanying drawings. It is to be appreciated that the drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Aspects and embodiments of the present disclosure are directed to a data collection device, and an enclosure that is designed to support acoustic equipment, including but not limited to equipment that is used to record audio, infrasonic and ultrasonic signals. In certain embodiments, the data collection device operates on a schedule, having active periods, during which the device is recording, and idle periods, during which a majority of the device components may be powered down. The enclosure is specially designed to protect the acoustic equipment and to enable safe access to a power supply, e.g., one or more batteries, to replace the power supply when required.

Embodiments of the present disclosure are directed to an enclosure that is particularly designed to maintain the integrity of the components housed within an interior of the enclosure. The enclosure utilizes a unique tri-functional hinge and latch mechanism that enables the acoustic equipment, including microphones, amplifiers, power supplies, controllers, and associated components, to operate in a safe and secure environment. Specifically, the enclosure includes a front cover, a back cover, and a middle cover, each of which is connected to one another by a pair of hinges. The back cover is configured to support, among other things, the power supply (e.g., batteries) used to power the acoustic equipment housed by the enclosure. The middle cover is configured to support a controller including a display, which is provided to display desired information to the operator of the enclosure after opening the front cover of the enclosure. The middle cover is secured to the back cover by a latch to enclose the space defined between the middle cover and the back cover when closing the middle cover, thereby protecting the acoustic equipment provided in the space between the middle cover and the back cover. The front cover is configured to enclose and protect the middle cover and the equipment secured to the middle cover, and to provide further protection for the acoustic components supported within the back wall. The front cover is secured to the back cover by another latch to enclose and seal the controller and the display supported by the middle cover, as well as the back cover and contents of the back cover when closing the front cover.

Figure 1:
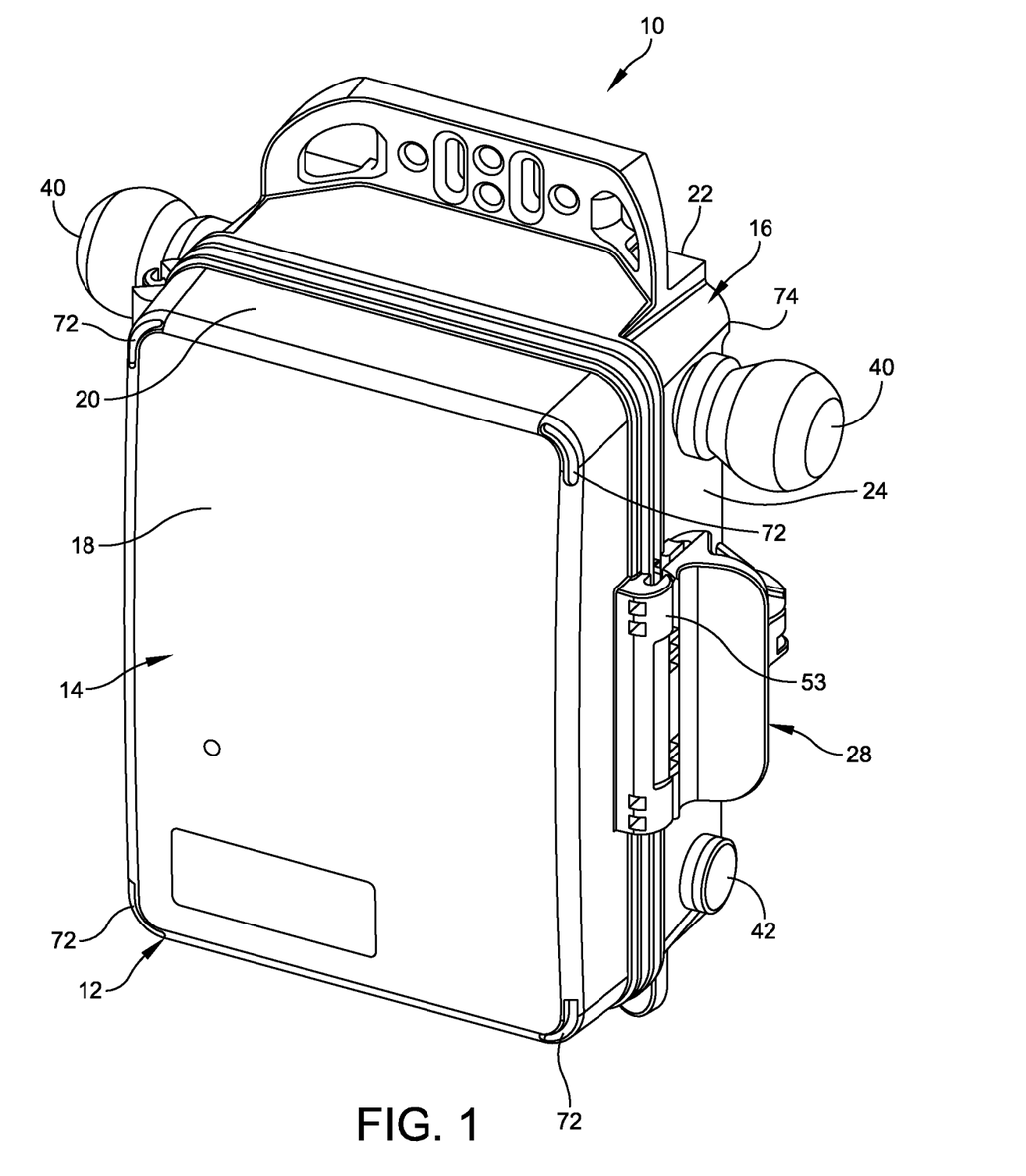
FIG. 1 is an isometric view of an enclosure for supporting acoustic equipment of an embodiment of the present disclosure.

Referring to the drawing figures, and more particularly to FIG. 1, an apparatus for autonomous data recording is generally indicated at 10. The apparatus 10 has a case comprising a generally box-shaped housing or enclosure, generally indicated at 12, with access to an interior of the enclosure through a tri-functional hinge. In a preferred embodiment, the enclosure 12 has a height (H) of approximately 8.60 inches, a width (W) of approximately 5.94 inches, and a depth (D) of approximately 3.00 inches. It should be understood that the size and shape of the enclosure 12 can be determined based on design constraints and requirements when deploying the apparatus 10 in the field. In one embodiment, the enclosure is fabricated from molded plastic material, such as a suitable polycarbonate material, which is strong and resistant to damage caused by ultraviolet light. It should be noted that any appropriate material may be selected to fabricate the enclosure 12, such as plastic, aluminum or carbon fiber.

The enclosure 12 includes a front cover, generally indicated at 14, and a back cover, generally indicated at 16. As shown, the front cover 14 includes a front wall 18 and a front peripheral wall 20, which extends generally perpendicularly from the front wall. Similarly, the back cover 16 includes a back wall 22 and a back peripheral wall 24, which extends generally from the back wall. When assembled, the front peripheral wall 20 and the back peripheral wall 24 of the front cover 14 and the back cover 16, respectively, are sized and shape to generally fit together to create an interior space of the enclosure 12. In a certain embodiment, the front peripheral wall 20 of the front cover 14 and the back peripheral wall 24 of the back cover may be configured to interlock through a middle cover as discussed below when closed to prevent, or substantially prevent, fluids from entering the enclosure 12.

The front peripheral wall 20 of the front cover 14 is connected to the back peripheral wall 24 of the back cover 16 by two hinges, each indicated at 26, provided along respective edges of the front and back peripheral walls. It should be noted that although two hinges 26 are provided, the front cover 14 and the back cover 16 may be connected to one another by a single hinge extending along the lengths of the respective edges of the covers, or by more than two hinges, may be provided. Also, any number of hinge designs can be employed beyond the particular embodiment shown in the drawing figures.

Figure 2:
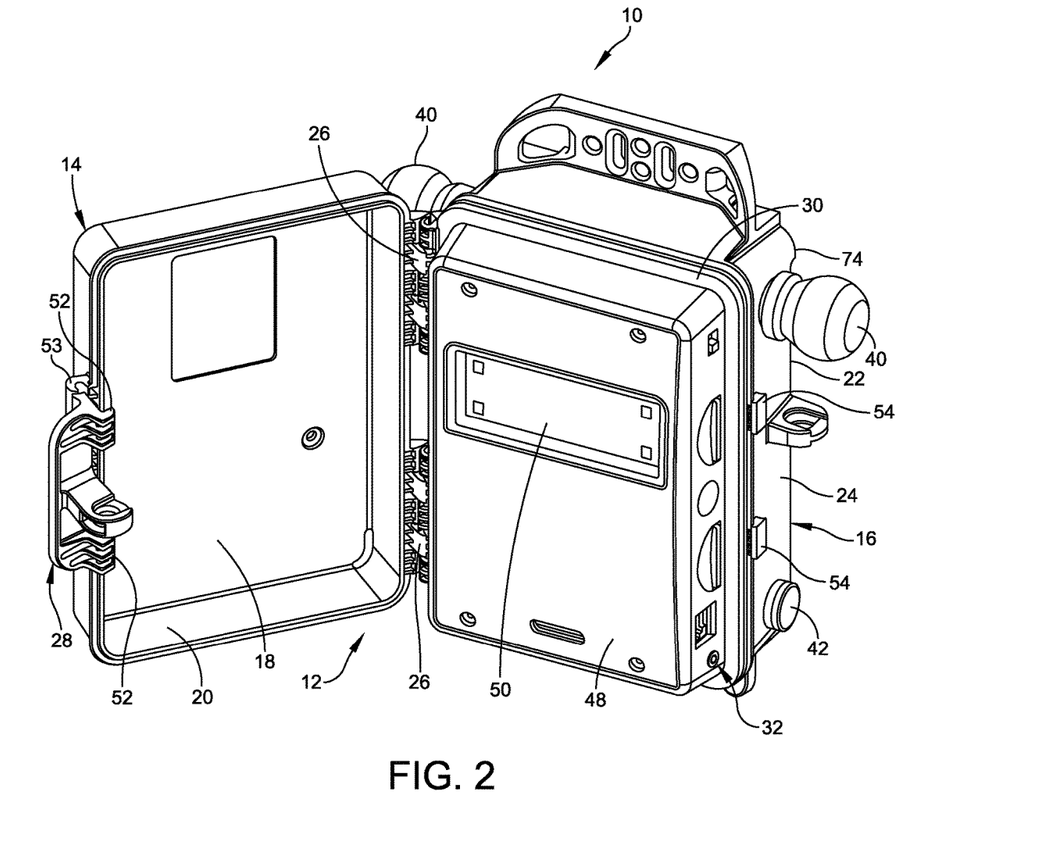
FIG. 2 is an isometric view of the enclosure with a front cover of the enclosure in an open position.

Referring to FIG. 2, the front cover 14 and the back cover 16 are capable of pivoting with respect to one another about an axis defined by the hinges 26, which enable the movement of the front cover and the back cover between an open position in which the front cover is spaced from the back cover, and a closed position in which the front cover engages the back cover through a middle cover discussed below. A latch, generally indicated at 28, is provided to releasably secure the front cover 14 to the back cover 16 in the closed position. The construction of the latch 28 will be described in greater detail as the description of the enclosure 12 proceeds.

Figure 3:
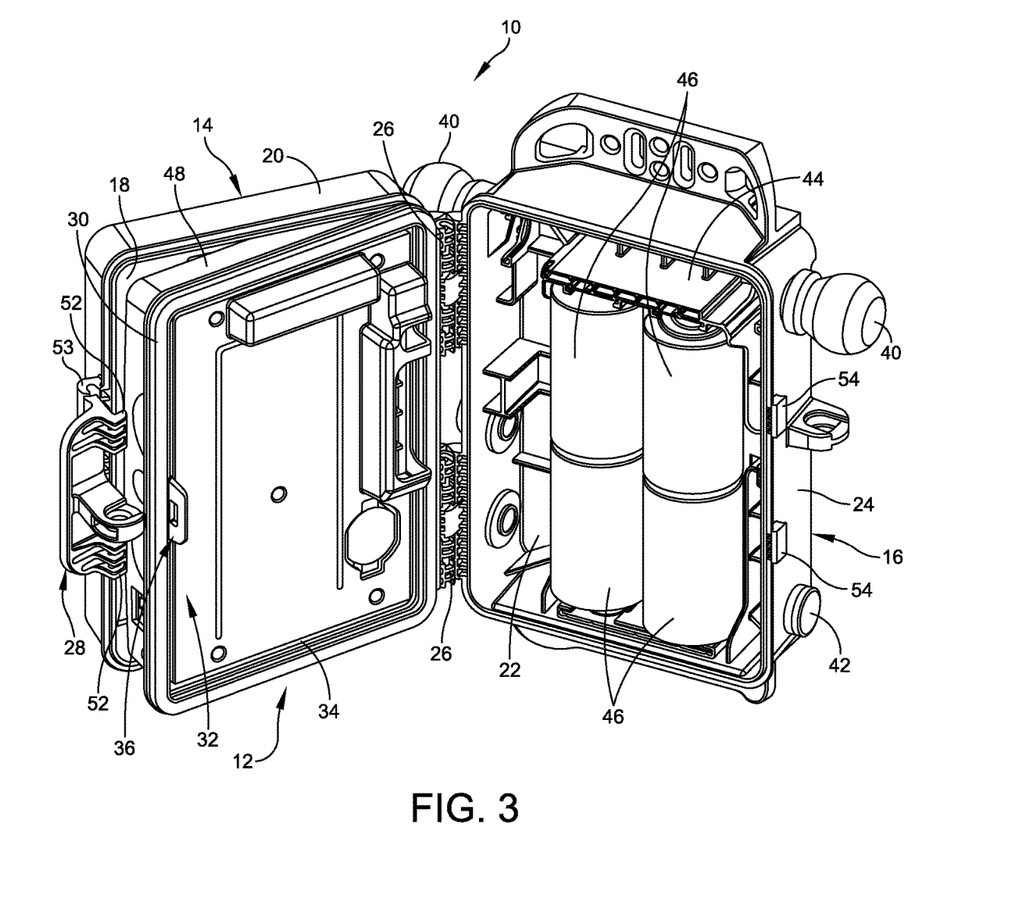
FIG. 3 is an isometric view of the enclosure with a middle cover also in an open position.

Referring to FIG. 3, the enclosure 12 further includes a middle cover, generally indicated at 32, disposed between the front cover 14 and the back cover 16. As shown, the middle cover 32 is also connected to the hinges 26, with the hinges further enabling the movement of the middle cover with respect to the back cover 16 between an open position in which the middle cover is spaced from the back peripheral wall 24 and a closed position in which the middle cover engages the back peripheral wall. As shown in FIG. 3, the middle cover 32 is capable of being pivoted about a hinge axis defined by the hinges 26, and moved independently from the front cover 14 and the back cover 16, assuming that the front cover is moved an open position or at least a partially opened position.

The middle cover 32 of the enclosure 12 includes an outer peripheral edge 34 that generally corresponds to the peripheral walls 20, 24 of the front and back covers 14, 16, respectively. In one embodiment, the peripheral edge 34 of the middle cover 32 is configured to engage the front peripheral wall 20 of the front cover 14 and the back peripheral wall 24 of the back cover 16 so that the front cover sandwiches the middle cover when moving the front cover to the closed position. The peripheral edge 34 of the middle cover 32 is firmly secured between the front cover 14 and the back cover 16 when closing the enclosure 12 and applying the latch 28.

Figure 3A:
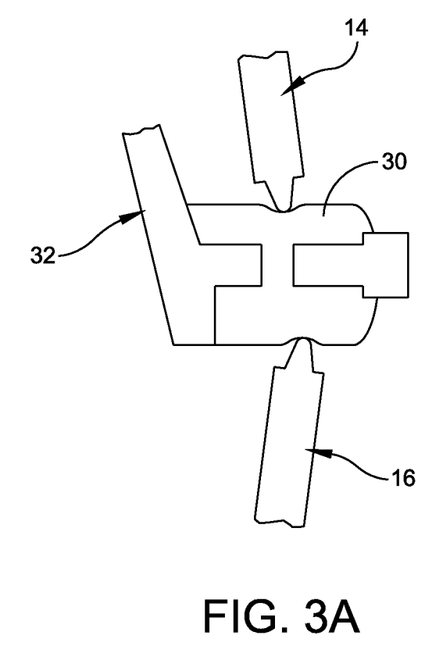
FIG. 3A is an enlarged cross-sectional detail of the front cover, the back cover and the middle cover in a closed position.

Referring additionally to FIG. 3A, a seal 30 is provided on the peripheral edge 34 of the middle cover 32 to seal a connection between an outer peripheral edge of the front peripheral wall 20 of the front cover 14 and the back peripheral wall 24 of the back cover 16 when the covers are in the closed position to protect the components of the acoustic equipment that are housed within the interior of the enclosure 12. The seal 30 may be configured and sized to operate with the particular structure of the front and back peripheral walls 20, 24 of the front and back covers, respectively. Although the seal 30 is provided on the peripheral edge 34 of the middle cover 32 it should be understood that the seal can be positioned on the outer edges of the front peripheral wall 20 of the front cover 14 and/or the back peripheral wall 24 of the back cover 16. As mentioned above, the enclosure 12 may be fabricated from a suitable polycarbonate material by an injection molded process. In one embodiment, the seal 30 may be created by overmolding a low durometer material over the hard durometer polycarbonate material forming the peripheral edge 34 of the middle cover 32 of the enclosure 12. However, the seal 30 may be fabricated from any type of process, such as a 3-D printing technique, or may be provided as a separate element that is secured in place with a suitable adhesive.

Another latch, generally indicated at 36, which is separate from latch 28, is provided to releasably secure the middle cover 32 to the back peripheral wall 24 of the back cover 16 to secure the middle cover and the back cover in the closed position. The latch 36 retains the middle cover 32 in the closed position thereby maintaining the protection of the components provided in the back cover 16 even when the front cover 14 is moved to the open position.

Figure 8:
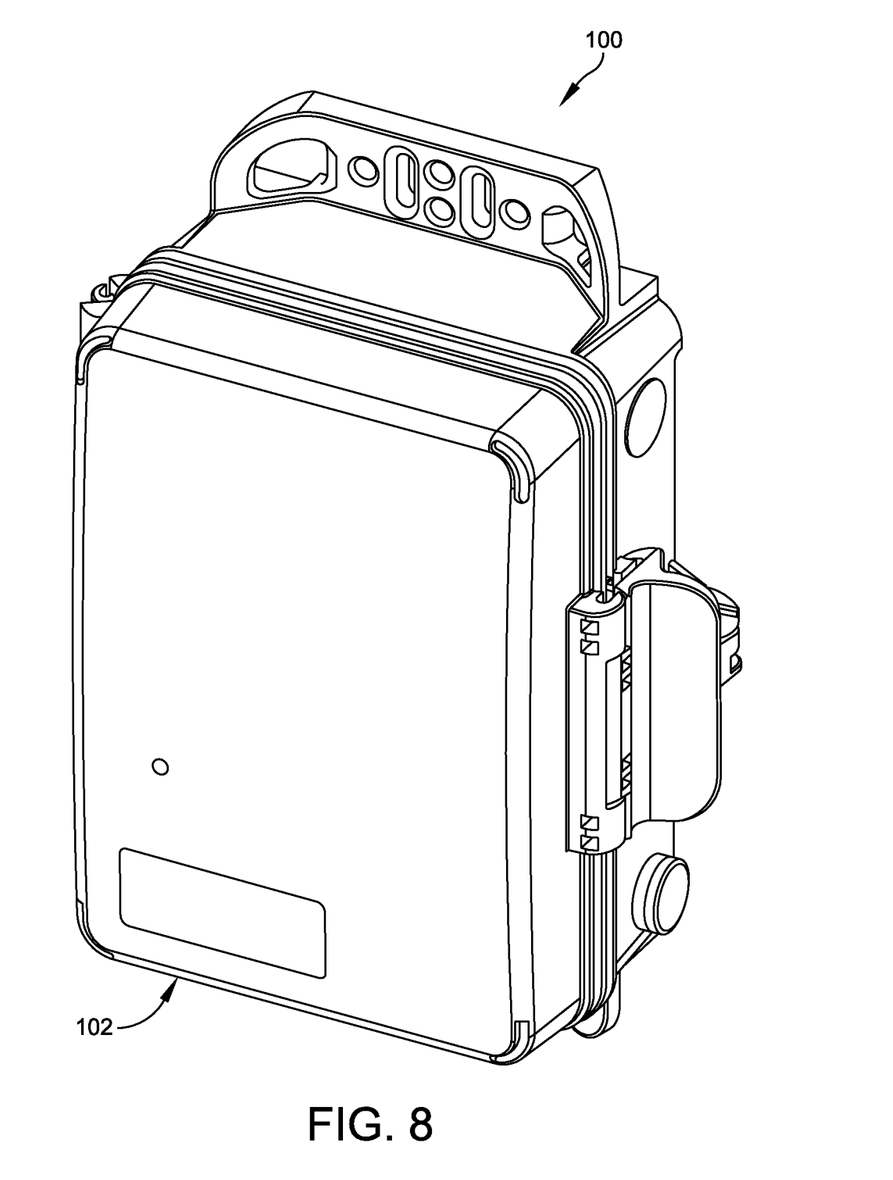
FIG. 8 is an isometric view of an enclosure of another embodiment of the disclosure.
Figure 9:
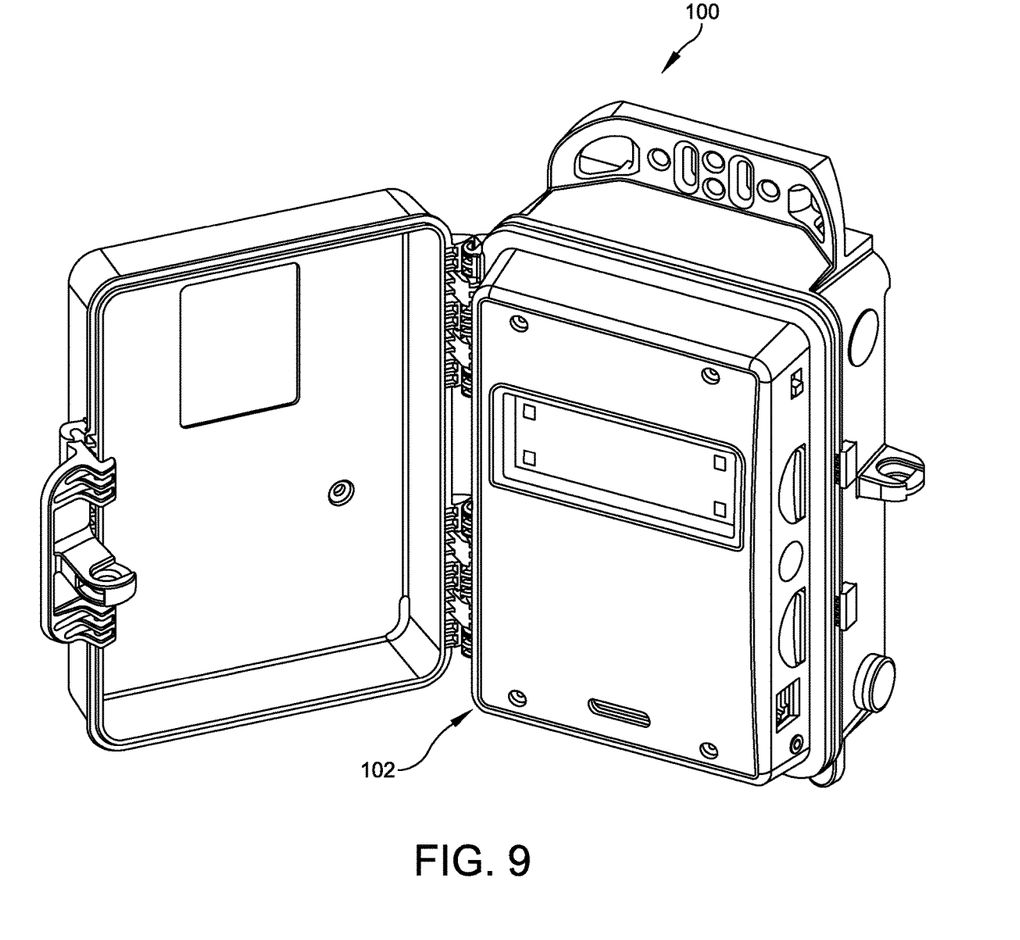
FIG. 9 is an isometric view of the enclosure shown in FIG. 8 with a front cover of the enclosure in an open position.
Figure 10:
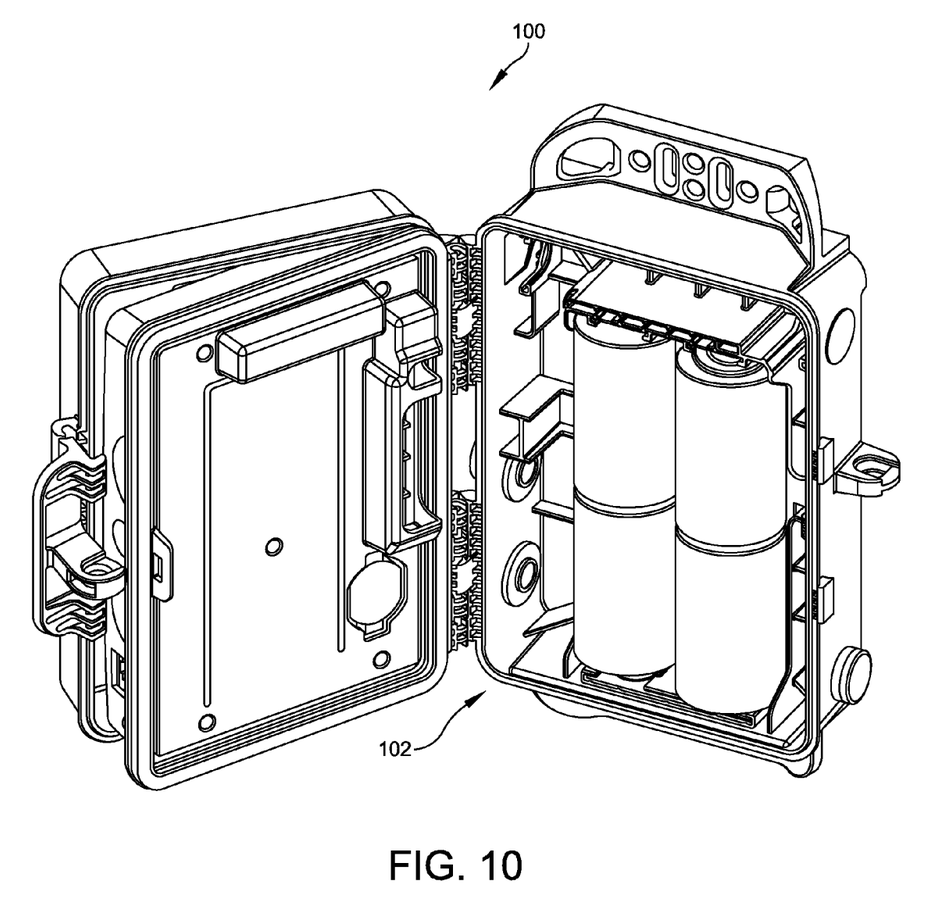
FIG. 10 is an isometric view of the enclosure shown in FIGS. 8 and 9 with a middle cover also in an open position.

Referring back to FIGS. 2 and 3, the front cover 14 essentially functions as a protective cover to protect the components housed within the interior of the enclosure 12. As shown, the back cover 16 houses two microphones, each indicated at 40, that each protrudes perpendicularly from the back peripheral wall 24 of the back cover 16. Each microphone 40 is secured within an opening formed in the back peripheral wall 24 of the back cover 16 with a weatherproof sealant (not shown) to prevent moisture damage within the interior of the enclosure 12. It should be noted that the microphones 40 may be positioned at any location on the exterior of the enclosure 12 to maximize the performance of the apparatus 10. It should also be noted that the provision of microphones 40 is particularly designed to record sounds made from birds and may be omitted when recording noises from other animals, such as bats, which may be recorded from external cabled microphones or a single microphone that are each configured to record ultrasound noises. Reference to an exemplary embodiment may be made to the embodiment of the apparatus shown in FIGS. 8-10. The back cover 16 further includes a pressure equalization vent 42 provided in the back peripheral wall 24 of the back cover 16, which is specially designed to equalize pressure and humidity within the enclosure 12 with atmospheric conditions outside the enclosure.

Referring to FIG. 3, the back cover 14 further includes a structure 44 that is configured to support and secure batteries, each indicated at 46, to power the apparatus 10. As shown, the structure 44 is configured to receive and secure four D-size batteries 46, although the structure may be configured to secure any size of battery. The batteries 46 are subject to expiration after a period of use, and the operator of the apparatus 10 needs to be able to access the batteries to replace them. The enclosure 12 of the apparatus 10 is designed to maintain the integrity of the interior of the enclosure even though the seal 30 between the front cover 14 and the middle cover 32 and the back cover 16 and the middle cover must be broken from time-to-time to access the batteries for replacement. After replacing the batteries 46 and re-securing the latch 28, the interior of the enclosure 12 is re-sealed to protect the interior of the enclosure from elements in which the apparatus 10 operates.

In one embodiment, as shown in FIG. 2, the middle cover 32 of the enclosure 12 supports a controller 48 having a display screen and keypad membrane 50 to allow the operator to control the operation of the apparatus 10. The controller 48 is configured to control the operation of the apparatus 10, and to obtain and store data obtained by the acoustic equipment, which is configured to record sounds via the microphones 40 or externally connected microphones. For example, a watertight or weather proof connector, such as a CONXALL® connector, may be provided on a left side of the enclosure 12 can be configured for external power and external microphones. With embodiments of an apparatus particularly configured for recording bird noises (e.g., the apparatus 10 shown in FIGS. 1-7), the two connectors at the top of the enclosure are for microphones and the connector at the bottom of the enclosure is for external power. With embodiments of an apparatus particularly configured for recording bat noises (e.g., the apparatus 100 shown in FIGS. 8-10), the connector at the top of the enclosure is for the microphone and the connector at the bottom of the enclosure is for external power. The controller 48 is further configured to display data to the operator on the display 50. In certain embodiments, a light indicator can be provided on an exterior of the enclosure 12 of the apparatus 10 through a light pipe affixed to the front cover 14 to indicate to the operator that the apparatus is functioning. Weatherproofing can be provided for all components that protrude outside the enclosure 12 of the apparatus 10.

As mentioned above, the enclosure 12 shown and described with respect to FIGS. 1-7 is particularly suited for use in recording and storing sounds made from birds. The microphones 40 are provided to detect sound waves generated from birds. Other embodiments of the enclosure 12 of the apparatus 10 may be particularly suited for recording the sounds generated from different animals, such as apparatus 100 shown in FIGS. 8-10.

Figure 4:
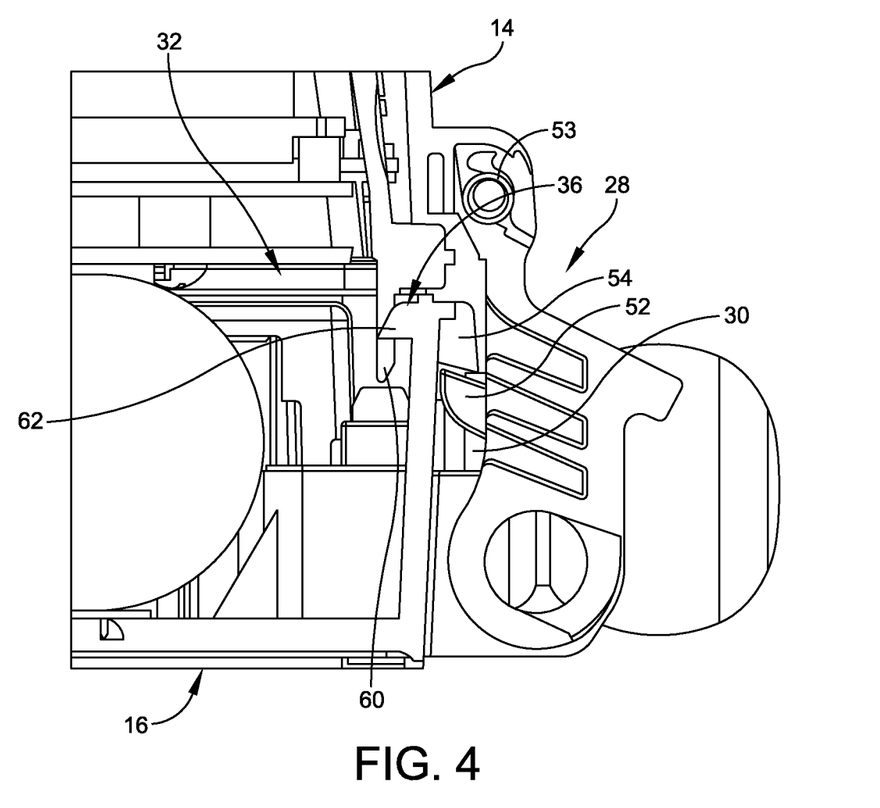
FIG. 4 is a cross-sectional view of two latches used to secure the front cover and the middle cover to the back cover of the enclosure.
Figure 5:
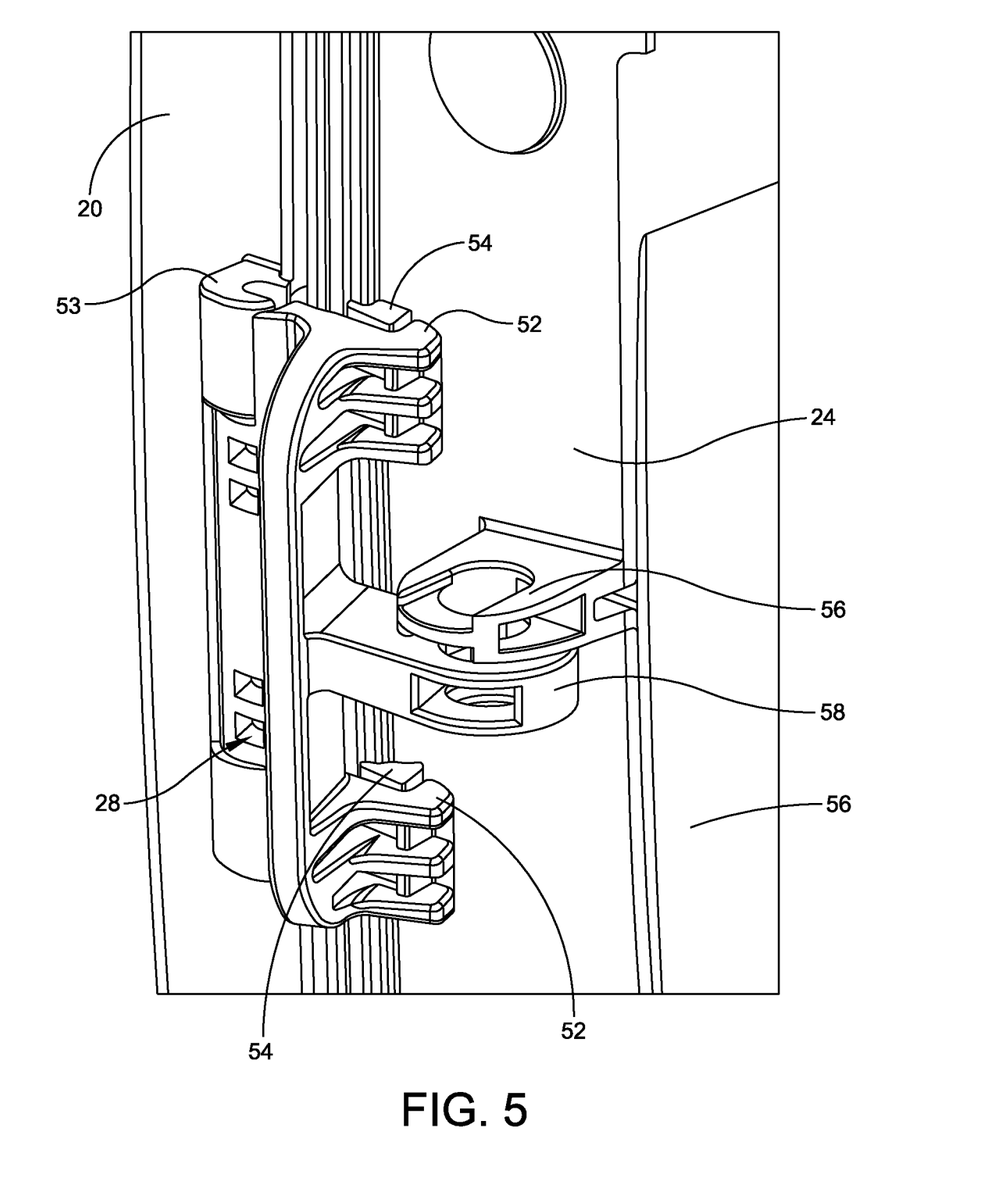
FIG. 5 is an enlarged isometric view of a latch used to secure front and back covers of the enclosure.

Referring additionally to FIGS. 4 and 5, the latch 28 associated with the front cover 14 and the back cover 16 includes a latching member 52 provided on a structure extending from the front peripheral wall 20 of and connected to the front cover through a hinge 53 and a mating latching member 54 provided on the back peripheral wall 24 of the back cover. The arrangement is such that the latching members 52, 54 of the latch 28 interlock when the latch pivots about the hinge 53 and is moved into its closed position either through use of a spring or manual closure of the latch. As shown, the latch 28 further includes a locking configuration associated with the latching member 52 and the mating latching member 54, with the locking configuration being configured to receive a lock to secure the enclosure 12 in the closed position. In one embodiment, the locking configuration includes a pair of spaced apart tabs, each indicated at 56, each with an opening formed therein that extend perpendicularly from the back peripheral wall 24 of the back cover 16, and a single tab 58 with an opening formed therein that extends perpendicularly from the structure extending from the front peripheral wall 20 of the front cover 14.

The arrangement is such that when the front cover 14 and the back cover 16 are in the closed position, the openings of the tabs 56 associated with the back peripheral wall 24 of the back cover 16 and the opening of the tab 58 associated with the front peripheral wall 20 of the front cover 14 are aligned to receive the lock therein. When employed, the lock specified by the manufacturer prevents the front cover 14 and the back cover 16 from being opened or breaking the seal 30 by the operator of the enclosure 12 of the apparatus 10.

Figure 6:
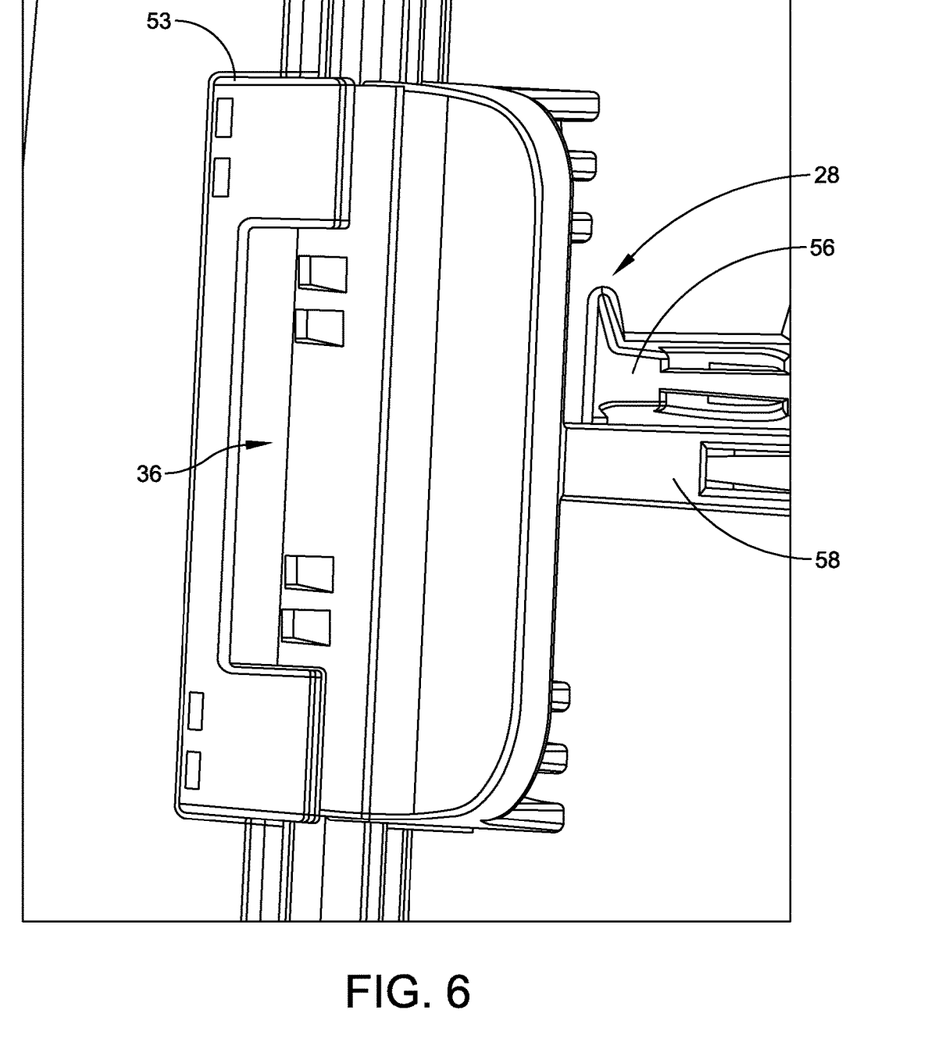
FIG. 6 is an enlarged isometric view of the latch from a different perspective used to secure the middle cover and the rear cover of the enclosure.

Referring to FIGS. 4 and 6, the latch 36 associated with the middle cover 32 and the back cover 16 includes a snap-fit member 60 provided on the peripheral edge 34 of the middle cover and a mating snap-fit member 62 provided on the back peripheral wall 24 of the back cover. One benefit of the arrangement of the latches 28, 36 is that the latch 28 associated with the front cover 14 and the back cover 16 is positioned directly outboard with respect to and over the latch 36 associated with the middle cover 32 and the back cover to protect the inboard latch. The latch 36 of the middle cover 32 maintains the middle cover in a secure, closed position while other operations are performed when the front cover 14 is opened. As mentioned above, the enclosure 12 is maintained in a sealed, protected position when the front cover 14 is latched together with the back cover 16 so that the front cover is sealed with respect to the middle cover 32 and the back cover is sealed to the middle cover.

Figure 7:
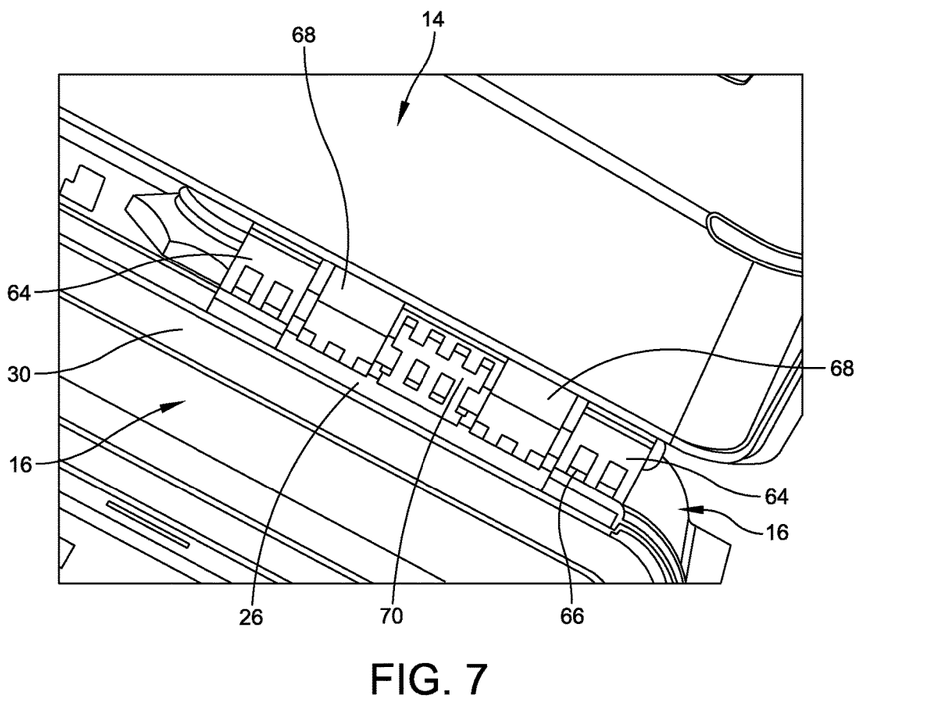
FIG. 7 is an isometric view of a hinge used to connect the front cover and the middle cover to the rear cover of the enclosure.

Referring to FIG. 7, the construction of the hinge 26 will be described. As shown, each hinge 26 includes a hinge element associated with the back cover 16, a hinge element associated with the front cover 14, and a hinge element associated with the middle cover 32. The hinge element associated with the back cover 16 includes a block, indicated at 70 formed from the back cover and a pin 66 that extends through and is secured by the blocks. The hinge element associated with the front cover 14 includes two blocks, each indicated at 68, formed from the front cover, each block having a central opening formed therein to receive the pin 66 of the hinge element associated with the back cover 16 when assembled. This construction enables the front cover 14 to pivot about the hinge axis with respect to the back cover 16. The hinge element associated with the middle cover 32 includes two blocks 64 formed from the middle cover, the block having a central opening formed therein to receive the pin 66 of the hinge element associated with the back cover 16 when assembled. In one embodiment since there are more than two components being connected through a single hinge, one component may have a hole while the other two components are slotted. In the shown embodiment, the middle cover 32 has the hole while the front cover 14 and the back cover 16 are slotted to enable movement of the components about the hinge 26.

The arrangement is such that each hinge 26 is capable of connecting the front cover 14 and the middle cover 32 to the back cover 16, enabling independent rotation of the front cover and the middle cover with respect to the back cover. Clearly, when the front cover 14 is latched to the back cover 16 with latch 28, the middle cover 32 is incapable of pivoting about the hinge with respect to the front cover and the back cover, but instead is captured between the front cover and the back cover. Other hinge constructions may be employed to achieve the desired movement of the front cover 14, the back cover 16 and the middle cover 32.

In some embodiments, the front cover 14 includes a first feature 72 and the back cover 16 includes a second feature 74. The first feature 72 and the second feature 74 enable stacking of the enclosure 12 on another enclosure. As shown, in one embodiment, the first feature 72 includes four recesses formed on the front wall 18 at the corners of the front wall of the front cover 14, and the second feature 74 includes four protrusions formed on the back wall 22 at the corners of the back wall of the back cover 16. The arrangement is such that the protrusions of the second feature 74 can be inserted into the recesses of the first feature 72 when stacking one enclosure 12 on another enclosure to firmly seat the enclosure. The provision of the first features 72 and the second features 74 enable multiple enclosures 12 to be stacked on one another, thereby facilitating the transport and storage of the enclosures.

In certain embodiments, the apparatus 10 may include a headphone jack on the exterior of the middle cover 32 (FIG. 2) to facilitate audio playback through the use of headphones, for example. In one embodiment, audio data is stored on removable digital mass storage device provided in the controller 48 provided within the enclosure 12.

As mentioned above, batteries, such as D-size batteries, may be used to power the apparatus, although other size and type of batteries may be employed. In addition, there may be an option with the apparatus 10 to power the apparatus by an external source.

In addition to the enclosure 12, the controller 48 of the apparatus 10 may also include or be configured to include means to analyze the recorded data (specialized computer software). Data analysis is performed on the controller 48 or may be transferred to another controller, such as a PC. The transfer of the audio data may be facilitated by the removable digital mass storage device. A flash or SD (example of possible formats) card reader connected to the controller may 48 provide the analysis software with access to the audio data. The data analysis components are twofold—ability to infer direction of sound and distance of sound.

As mentioned above, the embodiment of the enclosure 12 of apparatus 10 is particular suited for recording and storing sounds generated from birds. The apparatus, generally indicated at 100, shown in FIGS. 8-10, includes an enclosure, generally indicated at 102, which is particularly suited for recording and storing sounds generated from bats, for example. A specialized microphone may be provided.

It is to be appreciated that this invention is not limited in its application to the details of construction and the arrangement of components set forth in the following description or illustrated in the drawings. The invention is capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. In addition, it is to be appreciated that the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An apparatus for autonomous data recording comprising:
    acoustic equipment for recording autonomous data; and
    an enclosure to support the acoustic equipment, the enclosure including
        a front cover member,
        a middle cover member,
        a back cover member,
        at least one hinge configured to connect the front cover member to the back cover member, the at least one hinge enabling the movement of the front cover member and the back cover member between an open position in which the front cover member is spaced from the back cover member and a closed position in which the front cover member engages the back cover member,
        the middle cover member being disposed between the front cover member and the back cover member, the middle cover member being connected to the at least one hinge to enable movement of the middle cover member and the back cover member between an open position in which the middle cover member is spaced from the back peripheral wall and a closed position in which the middle cover member engages the back peripheral wall,
        a first latch configured to releasably secure the middle cover member to the back cover member to secure the middle cover member and the back cover member in the closed position, and
        a second latch configured to releasably secure the front cover member to the back cover member to secure the front cover member and the back cover member in the closed position.

2. The apparatus of claim 1, wherein the front cover member has a front wall and a front peripheral wall extending from the front wall, and wherein the back cover member has a back wall and a back peripheral wall extending from the back wall.

3. The apparatus of claim 2, wherein the enclosure includes a seal configured to seal a connection between the back peripheral wall of the back cover member and the middle cover member and the front peripheral wall of the front cover member and the middle cover member.

4. The apparatus of claim 3, wherein the seal is created by overmolding a low durometer material over a hard durometer material forming a peripheral edge of the middle cover member.

5. The apparatus of claim 4, wherein the first latch includes a snap-fit member associated with an edge of the middle cover member and a mating snap-fit member associated with the back peripheral wall of the back cover member.

6. The apparatus of claim 5, wherein the second latch includes a latching member associated with the second latch, which is connected to the front cover member through a hinge that allows the second latch to pivot between an engaged latched position and a disengaged release position and a second mating latching member associated with the back peripheral wall of the back cover member.

7. The apparatus of claim 6, wherein the second latch includes a locking configuration associated with the second snap-fit member and the second mating snap-fit member, the locking configuration being configured to receive a lock.

8. The apparatus of claim 2, wherein the at least one hinge is configured to connect a front edge of the front peripheral wall of the front cover member to a back edge of the back peripheral wall of the back cover member.

9. The apparatus of claim 2, wherein the middle cover member includes a middle cover edge connected to the at least one hinge.

10. The apparatus of claim 2, wherein the front cover member includes a first feature and the back cover member includes a second feature, the first feature and the second feature enabling stacking of the enclosure on another enclosure.

11. The apparatus of claim 10, wherein the first feature includes one of several protrusions and recesses formed on the front wall of the front cover member and the second feature includes the other of several protrusions and recesses formed on the back wall of the back cover member.

12. The apparatus of claim 1, wherein the second latch is positioned outboard with respect to the first latch.

13. The apparatus of claim 1, wherein the back cover member is configured to support at least one battery.

14. A method of enclosing and sealing acoustic equipment within an enclosure, the method comprising:
    providing several components of acoustic equipment within a rear cover member of the enclosure;
    securing a middle cover member to the rear cover member with a first latch, the middle cover member being configured to support several additional components of acoustic equipment; and
    sealingly engaging a front cover member to the middle cover member and the rear cover member to the middle cover member with a second latch.

15. The method of claim 14, further comprising connecting the middle cover member to the rear cover member with the at least one hinge, the at least one hinge further enabling the movement of the middle cover member and the back cover member between an open position in which the middle cover member is spaced from the back peripheral wall and a closed position in which the middle cover member engages the back peripheral wall.

16. The method of claim 15, further comprising a hinged connection of the front cover member to the back cover member with at least one hinge, the at least one hinge enabling the movement of the front cover member and the back cover member between an open position in which the front cover member is spaced from the back cover member and a closed position in which the front cover member engages the back cover member.

17. The method of claim 14, further comprising locking the second latch with a locking configuration, the locking configuration being configured to receive a lock.

18. The method of claim 14, further comprising stacking the enclosure on another enclosure.

19. The method of claim 18, wherein the front cover member includes a first feature and the back cover member includes a second feature, the first feature and the second feature enabling the stacking of the enclosure on another enclosure.

20. The method of claim 14, wherein the second latch is positioned outboard with respect to the first latch.

* * * * *